United States Patent
Li (10) Patent No.: US 11,424,293 B2
(45) Date of Patent: Aug. 23, 2022

(54) METHOD FOR MANUFACTURING DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Xiuyan Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 258 days.

(21) Appl. No.: 16/603,694

(22) PCT Filed: May 10, 2019

(86) PCT No.: PCT/CN2019/086410
§ 371 (c)(1),
(2) Date: Oct. 8, 2019

(87) PCT Pub. No.: WO2020/155464
PCT Pub. Date: Aug. 6, 2020

(65) Prior Publication Data
US 2021/0335912 A1   Oct. 28, 2021

(30) Foreign Application Priority Data
Jan. 30, 2019 (CN) .................. 201910093576.X (51) Int. Cl.
*H01L 27/32* (2006.01)
*H01L 51/56* (2006.01)
(Continued)

(52) U.S. Cl.
CPC ...... *H01L 27/3218* (2013.01); *H01L 27/3211* (2013.01); *H01L 27/3246* (2013.01);
(Continued)

(58) Field of Classification Search
CPC ... H01L 27/3211–3218; H01L 27/3246; H01L 51/5265; H01L 2251/558; H01L 51/5012–5044
See application file for complete search history.

(56) References Cited

U.S. PATENT DOCUMENTS 10,665,638 B2 * 5/2020 Hsu ............... H01L 27/3204
11,158,836 B2 * 10/2021 Lin ................ H01L 51/5253
(Continued)

FOREIGN PATENT DOCUMENTS

CN    103779380 A   5/2014
CN    105720081 A   6/2016
(Continued)

OTHER PUBLICATIONS

Machine translation, Wang, Chinese Pat. Pub. No. CN 108493350-A, translation date: Aug. 16, 2021, Espacenet, all pages. (Year: 2021).*
(Continued)

*Primary Examiner* — Victoria K. Hall (57) ABSTRACT

The present disclosure provides a display panel. The light-emitting layers within a same sub-pixel have different thicknesses, and emit light that overlap with each other at the same time, resulting in that the peak of the overall microcavity characteristic curve has a wide range. Thus, the position of the peak of the overall microcavity characteristic curve produced by the sub-pixel can overlap with the position of the peak of the inherent brightness characteristic curve of the light-emitting layer within a wider range of angles, such that the electroluminescence spectrum changes
(Continued)

less with change of viewing angles. Therefore, the color shift at different viewing angles is reduced, and there is no substantial difference for visual sensation for color when viewing the OLED display panel including such sub-pixels at different viewing angles.

2 Claims, 11 Drawing Sheets

(51) Int. Cl.
  *H01L 51/50* (2006.01)
  *H01L 51/52* (2006.01)
  *H01L 51/00* (2006.01)

(52) U.S. Cl.
  CPC ...... *H01L 51/0011* (2013.01); *H01L 51/0012* (2013.01); *H01L 51/50* (2013.01); *H01L 51/5012* (2013.01); *H01L 51/52* (2013.01); *H01L 51/5265* (2013.01); *H01L 51/56* (2013.01); *H01L 2251/558* (2013.01)

(56) References Cited

U.S. PATENT DOCUMENTS

| | | | | |
|---|---|---|---|---|
| 11,296,149 | B2* | 4/2022 | Hu | H01L 51/5265 |
| 2009/0051275 | A1* | 2/2009 | Kobayashi | H01L 51/5036 257/E21.007 |
| 2010/0265223 | A1* | 10/2010 | Asaki | H01L 51/5203 345/205 |
| 2012/0235126 | A1* | 9/2012 | Yamazaki | H01L 51/5036 257/E51.001 |
| 2013/0320367 | A1* | 12/2013 | Hong | H01L 27/3283 257/89 |
| 2014/0110701 | A1 | 4/2014 | Noh | |
| 2014/0197385 | A1* | 7/2014 | Madigan | H01L 51/5056 257/40 |
| 2014/0217372 | A1* | 8/2014 | Shim | H01L 51/5012 257/40 |
| 2017/0092705 | A1* | 3/2017 | Lim | H01L 27/326 |
| 2017/0110519 | A1* | 4/2017 | Hsu | H01L 27/3211 |
| 2017/0125496 | A1* | 5/2017 | Oh | H01L 51/5265 |
| 2017/0194414 | A1* | 7/2017 | Lee | H01L 51/0003 |
| 2017/0243928 | A1 | 8/2017 | Yang | |
| 2017/0287993 | A1* | 10/2017 | Takata | H01L 27/3211 |
| 2018/0130852 | A1* | 5/2018 | Hsu | H01L 27/3246 |
| 2018/0138435 | A1* | 5/2018 | Kim | H01L 27/3246 |
| 2018/0166510 | A1* | 6/2018 | Lee | H01L 27/3218 |
| 2018/0175118 | A1* | 6/2018 | Toyoda | H01L 51/5203 |
| 2018/0190736 | A1* | 7/2018 | Kim | H01L 27/322 |
| 2018/0190923 | A1* | 7/2018 | Heo | H01L 27/3246 |
| 2018/0269268 | A1* | 9/2018 | Cai | H01L 51/5203 |
| 2018/0342570 | A1* | 11/2018 | Hong | H01L 27/3262 |
| 2019/0074329 | A1* | 3/2019 | Kim | H01L 27/3276 |
| 2019/0165318 | A1* | 5/2019 | Choi | H01L 51/56 |
| 2019/0206955 | A1* | 7/2019 | Paek | H01L 27/326 |
| 2019/0237523 | A1* | 8/2019 | Zhai | H01L 27/3218 |
| 2019/0305057 | A1* | 10/2019 | Cheng | H01L 51/5036 |
| 2019/0326537 | A1* | 10/2019 | Kobayashi | H01L 51/0005 |
| 2020/0176531 | A1* | 6/2020 | Baek | H01L 27/3218 |
| 2020/0203384 | A1* | 6/2020 | Huo | H01L 27/1288 |
| 2020/0203449 | A1* | 6/2020 | Jeon | H01L 27/3246 |
| 2020/0212146 | A1* | 7/2020 | Shin | H01L 27/326 |
| 2020/0212347 | A1* | 7/2020 | Park | H01L 51/5218 |
| 2020/0227666 | A1* | 7/2020 | Fan | H01L 51/5265 |
| 2020/0251535 | A1* | 8/2020 | Fan | H01L 27/3218 |
| 2020/0358019 | A1* | 11/2020 | Tsai | H01L 51/5265 |
| 2021/0134894 | A1* | 5/2021 | Peng | H01L 51/56 |
| 2021/0335901 | A1* | 10/2021 | Hu | H01L 51/56 |
| 2021/0335915 | A1* | 10/2021 | Qin | H01L 27/3234 |

FOREIGN PATENT DOCUMENTS

| | | | | |
|---|---|---|---|---|
| CN | 106816453 | A | 6/2017 | |
| CN | 108448007 | A * | 8/2018 | ......... H01L 27/3211 |
| CN | 108493350 | A * | 9/2018 | ......... H01L 27/3244 |
| CN | 108574052 | A * | 9/2018 | ......... H01L 51/5036 |

OTHER PUBLICATIONS

Machine translation, Lin, Chinese Pat. Pub. No. CN 108574052-A, translation date: Aug. 16, 2021, Espacenet, all pages. (Year: 2021).*
Machine translation, Lin, Chinese Pat. Pub. No. CN 108448007-A, translation date: Aug. 16, 2021, Espacenet, all pages. (Year: 2021).*
Written Opinion of the International Searching Authority, International App. No. PCT/CN2019/086410, dated Oct. 30, 2019, all pages. (Year: 2019).*

* cited by examiner

Replacement Sheet

Replacement Sheet

METHOD FOR MANUFACTURING DISPLAY PANEL

FIELD OF INVENTION

The present disclosure relates to a field of display technology, and more particularly, to a display panel, a method for manufacturing the same, and an electronic device including the same.

BACKGROUND

Because organic light emitting diode (OLED) display devices, compared to current mainstream thin film transistor liquid crystal displays (TFT-LCDs), have advantages, such as wide viewing angles, high brightness, high contrast, low power consumption, light weight, and thin thickness, OLED display devices attract user attention among various types of flat panel displays. OLED display devices are categorized to include passive matrix OLED (PM-OLED) and active matrix OLED (AM-OLED) based on a driving mode thereof. In comparison with PM-OLED, AM-OLED have advantages including large quantity of display information, low power consumption, long lifespan of devices, high contrast of displayed images.

Figure 1A:
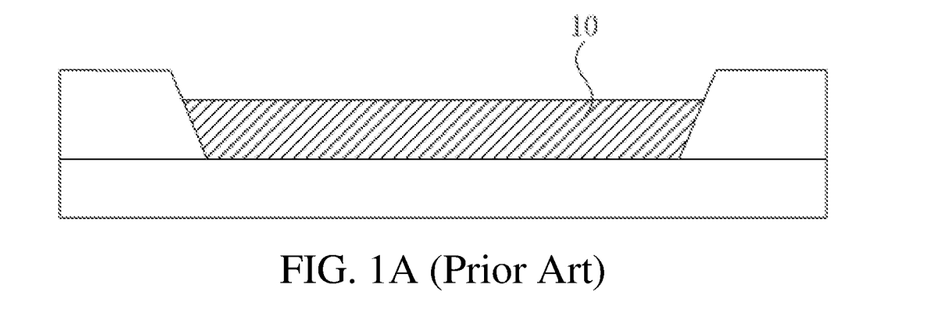
FIG. 1A shows a cross-sectional view of a structure of a sub-pixel of an OLED display panel according to prior art.
Figure 1B:
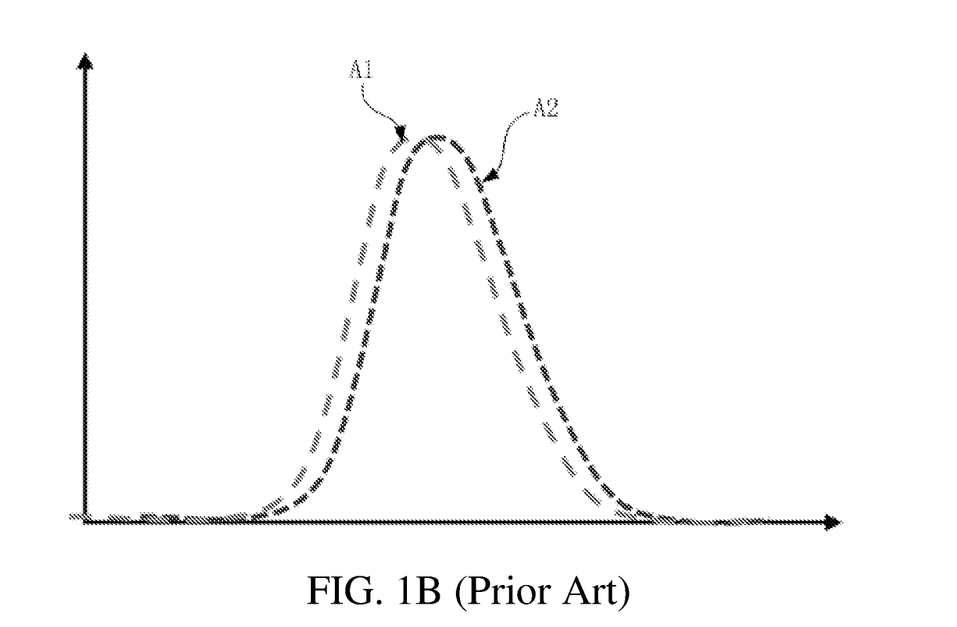
FIG. 1B shows an inherent brightness characteristic curve of a light-emitting layer of a sub-pixel and a microcavity characteristic curve of a light-emitting area according to a current OLED display panel, wherein the curve pointed at by the arrow A1 is the inherent brightness characteristic curve of the light-emitting layer of the sub-pixel, and the curve pointed at by the arrow A2 is the microcavity characteristic curve of the light-emitting area.
Figure 1C:
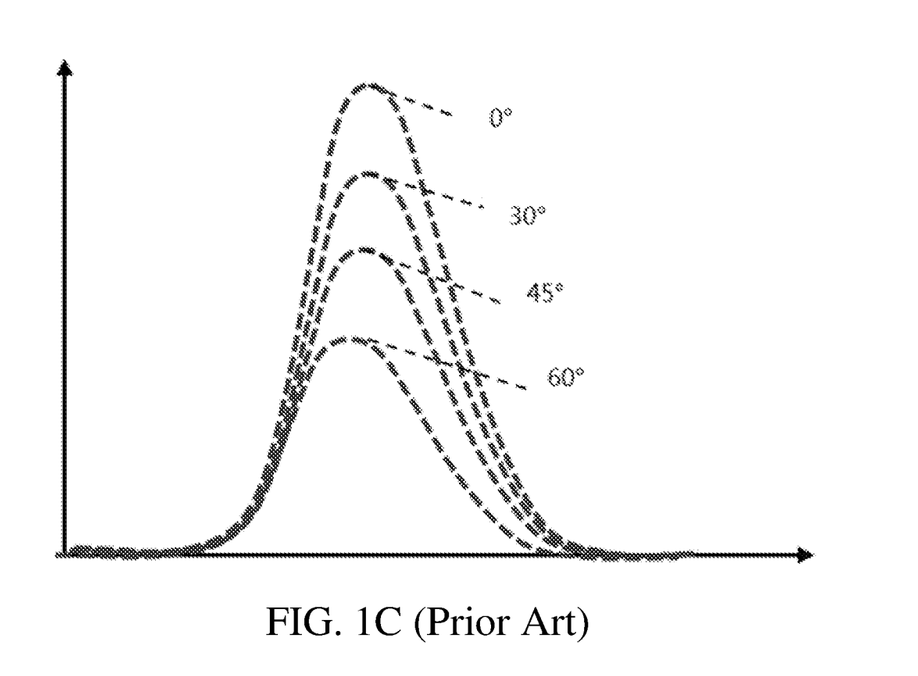
FIG. 1C shows electroluminescence spectrum at different viewing angles according to the current OLED display panel.

FIG. 1A shows a cross-sectional view of a structure of a sub-pixel of an OLED display panel according to prior art. A light-emitting layer 10 of the OLED display panel has a uniform thickness. FIG. 1B shows an inherent brightness characteristic curve of a light-emitting layer of a sub-pixel and a microcavity characteristic curve of a light-emitting area according to a current OLED display panel, wherein the curve pointed at by the arrow A1 is the inherent brightness characteristic curve of the light-emitting layer of the sub-pixel, and the curve pointed at by the arrow A2 is the microcavity characteristic curve of the light-emitting area. FIG. 1C shows electroluminescence spectrum at different viewing angles according to the current OLED display panel. Please refer to FIGS. 1B and 1C. FIG. 1C shows electroluminescence spectrum at viewing angles of 0 degrees, 30 degrees, 45 degrees, and 60 degrees. Obviously, the electroluminescence spectrum changes a lot at different viewing angles. This results in color shift and reduction in brightness, which makes the color images composed of RGB have color shift because of visual difference, and thus users have different visual sensation for color when viewing the OLED display panel at different viewing angles.

SUMMARY OF DISCLOSURE

Technical Problems

The objective of the present disclosure is to provide a display panel, a method for manufacturing the same, and an electronic device including the same, where the electroluminescence spectrum changes less with change of viewing angles, the color shift at different viewing angles is reduced, and there is no substantial difference for visual sensation for color when viewing the OLED display panel including such sub-pixels at different viewing angles.

Technical Solutions

To solve the aforementioned problems, the present disclosure provides a display panel including a plurality of sub-pixels, wherein at least one of the sub-pixels comprises at least one first light-emitting area and at least one second light-emitting area, the first light-emitting area and the second light-emitting area are sequentially arranged in a direction perpendicular to a light-emitting direction of the sub-pixel, a first light-emitting layer is disposed in the first light-emitting area, a second light-emitting layer is disposed in the second light-emitting area, and a thickness of the second light-emitting layer is greater than a thickness of the first light-emitting layer.

In one embodiment, the sub-pixel further comprises a pixel defining layer, the pixel defining layer includes at least one first opening and at least one second opening, the first opening is positioned to correspond to the first light-emitting area, the first light-emitting layer is disposed in the first opening, the second opening is positioned to correspond to the second light-emitting area, and the second light-emitting layer is disposed in the second opening.

In one embodiment, the sub-pixel further comprises a pixel defining layer, the pixel defining layer includes at least one first opening, the first opening is positioned to correspond to the first light-emitting area and the second light-emitting area, and the first light-emitting layer and the second light-emitting layer are disposed in a same first opening.

In one embodiment, the sub-pixel further comprises one first light-emitting area and one second light-emitting area, and the first light-emitting area and the second light-emitting area are sequentially arranged in the direction perpendicular to the light-emitting direction of the sub-pixel.

The present disclosure further provides a method for manufacturing the above-said display panel, comprising steps of:
  providing a first mask having at least one first deposition hole, positioning the first deposition hole to correspond to the first opening, and depositing the first light-emitting layer in the first opening; and
  providing a second mask having at least one second deposition hole, positioning the second deposition hole to correspond to the second opening, and depositing the second light-emitting layer in the second opening such that thickness of the second light-emitting layer is greater than the thickness of the first light-emitting layer.

In one embodiment, the first mask and the second mask are same, and in the step of providing the second mask, the first mask is moved to position the first deposition hole to correspond to the second opening, and the second light-emitting layer is deposited in the second light-emitting area.

The present disclosure further provides a method for manufacturing the above-said display panel, comprising steps of:
  providing a first mask having at least one first deposition hole, positioning the first deposition hole to correspond to the first opening, and depositing a bottom light-emitting layer in the first opening; and
  providing a second mask having at least one second deposition hole, positioning the second deposition hole to correspond to a portion of the first opening, and depositing a top light-emitting layer in the first opening such that the bottom light-emitting layer overlaps with the top light-emitting layer to constitute the second light-emitting layer, and the bottom light-emitting layer constitutes the first light-emitting layer in a non-overlapping region.

In one embodiment, the first mask and the second mask are same, and in the step of providing the second mask, the first mask is moved to position the first deposition hole to correspond to a portion of the first opening, and the top light-emitting layer is deposited in the first opening.

In addition, the present disclosure provides an electronic device, comprising the above-said display panel.

In one embodiment, the display panel includes a first type of sub-pixel, a second type of sub-pixel, and a third type of sub-pixel, wherein at least one type of the sub-pixels has a structure that is the same as that of the above-said sub-pixel.

Beneficial Effects

The present disclosure provides the following beneficial effects. Different light-emitting layers having different thickness produce different microcavity characteristic curve, and the peaks thereof have different positions. The light-emitting layers within the same sub-pixel have different thicknesses, and emit light that overlap with each other at the same time, resulting in that the peak of the overall microcavity characteristic curve has a wide range. Thus, the position of the peak of the overall microcavity characteristic curve produced by the sub-pixel can overlap with the position of the peak of the inherent brightness characteristic curve of the light-emitting layer within a wider range of angles, such that the electroluminescence spectrum changes less with change of viewing angles, the color shift at different viewing angles is reduced, and there is no substantial difference for visual sensation for color when viewing the OLED display panel including such sub-pixels at different viewing angles.

DETAILED DESCRIPTION

A further description of the implementation of a display panel, a method for manufacturing the same, and an electronic device including the same of the present disclosure are provided below in detail, in conjunction with the drawings and the embodiments. Because the present invention is characterized in structure of the sub-pixels, the drawings merely show the structure of the sub-pixels. The structures of other portions of the display panel are commonly used structures.

Figure 2:
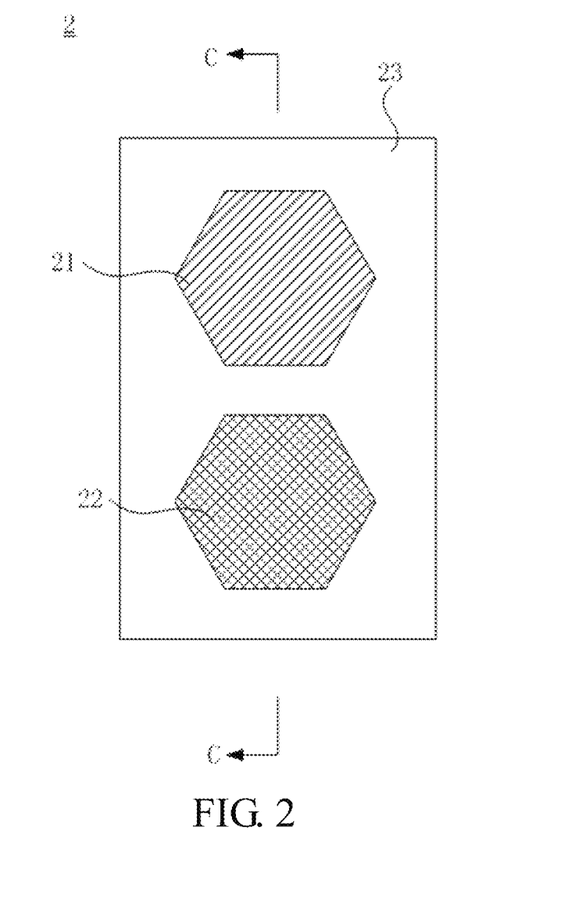
FIG. 2 shows a top view of a sub-pixel of a display panel according to a first embodiment of the present disclosure.
Figure 3:
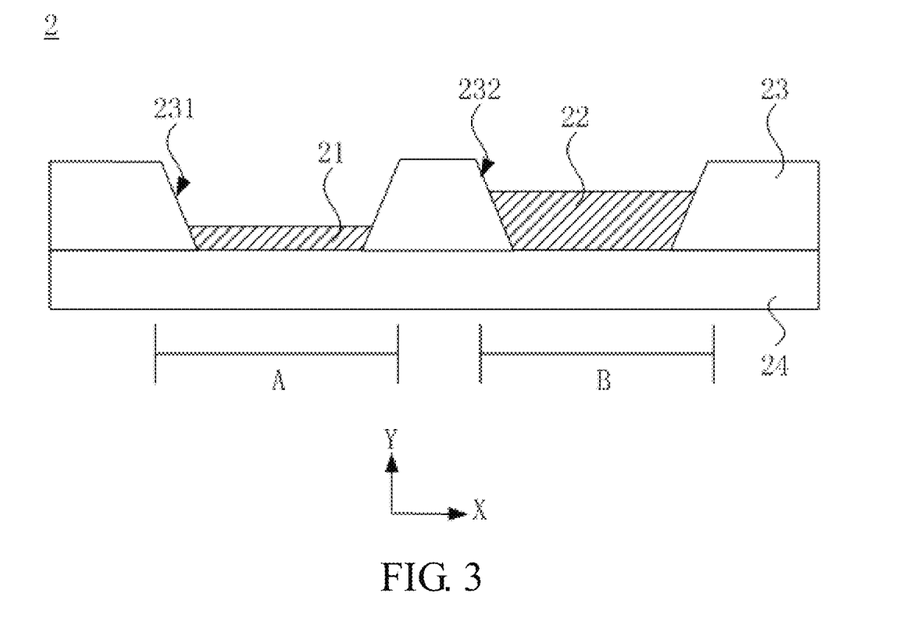
FIG. 3 shows a cross-sectional view of FIG. 2 cut along line C-C.

Please refer to FIGS. 2 and 3. FIG. 2 shows a top view of a sub-pixel of a display panel according to a first embodiment of the present disclosure. FIG. 3 shows a cross-sectional view of FIG. 2 cut along line C-C. The display panel of the present disclosure includes a plurality of sub-pixels 2, wherein at least one of the sub-pixels 2 includes at least one first light-emitting area A and at least one second light-emitting area B. The sub-pixels include a red sub-pixel, a green sub-pixel, a blue sub-pixel, or a white sub-pixel. However, the sub-pixels are not limited thereto. In the present embodiment, the sub-pixels 2 include one first light-emitting area A and one second light-emitting area B. In other embodiments of the present disclosure, the sub-pixels 2 can include a plurality of first light-emitting areas A and a plurality of second light-emitting areas B, which are alternated with each other.

The first light-emitting area A and the second light-emitting area B are sequentially arranged in a direction perpendicular to a light-emitting direction of the sub-pixel 2. For example, in the present embodiment, the light-emitting direction of the sub-pixel 2 is the Y direction shown in FIG. 3, and the first light-emitting area A and the second light-emitting area B are sequentially arranged in the X direction perpendicular to the Y direction.

A first light-emitting layer 21 is disposed in the first light-emitting area A. A second light-emitting layer 22 is disposed in the second light-emitting area B. Both the first light-emitting layer 21 and the second light-emitting layer 22 are an organic light emitting diode (OLED) layer, where a structure thereof is well-known by any person having ordinary skill in the art. Because the first light-emitting layer 21 and the second light-emitting layer 22 are disposed within a same sub-pixel, the first light-emitting layer 21 and the second light-emitting layer 22 emit a same color of light. For example, if the sub-pixel 2 is a red sub-pixel, both the first light-emitting layer 21 and the second light-emitting layer 22 emit a red light. And, if the sub-pixel 2 is a green sub-pixel, both the first light-emitting layer 21 and the second light-emitting layer 22 emit a green light.

A thickness of the second light-emitting layer 22 is greater than a thickness of the first light-emitting layer 21. That is, the thickness of the light-emitting layer varies within a same sub-pixel. Because the thickness of the second light-emitting layer 22 is different from the thickness of the first light-emitting layer 21, the microcavity characteristic curve produced by the second light-emitting layer 22 is different from the microcavity characteristic curve produced by the first light-emitting layer 21. Specifically, a position of a peak of the microcavity characteristic curve produced by the second light-emitting layer 22 is different from a position of a peak of the microcavity characteristic curve produced by the first light-emitting layer 21.

Figure 4:
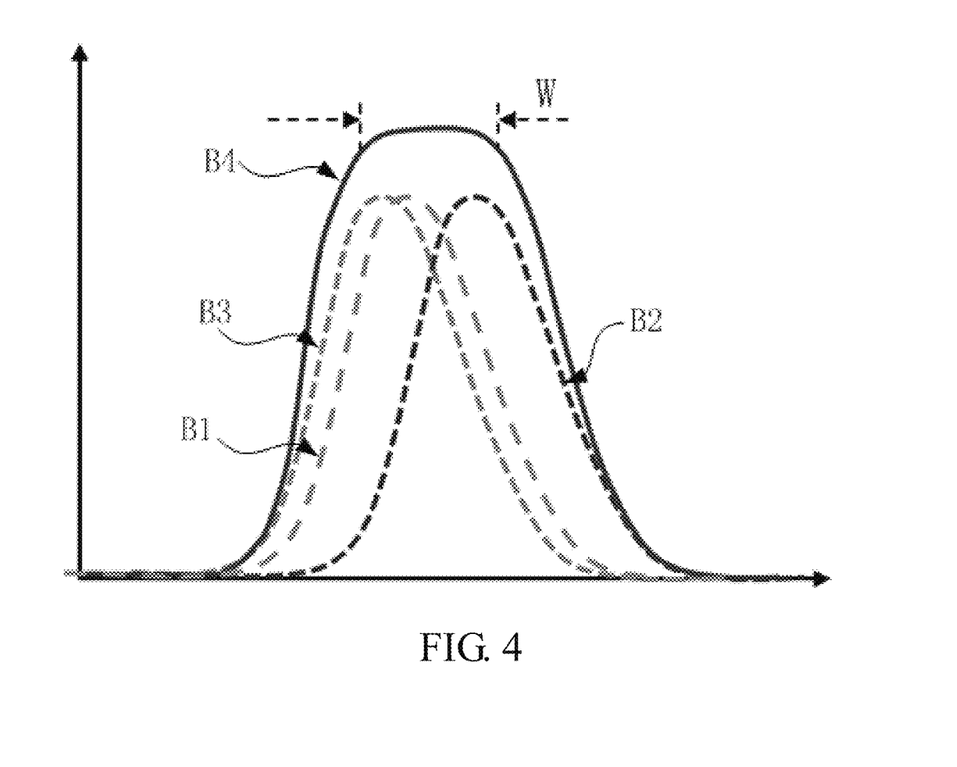
FIG. 4 shows an inherent brightness characteristic curve of a light-emitting layer of a sub-pixel and a microcavity characteristic curve of a light-emitting area according to a display panel of the present disclosure, wherein the curve pointed at by the arrow B1 is the inherent brightness characteristic curve of the light-emitting layer of the sub-pixel, the curve pointed at by the arrow B2 is the microcavity characteristic curve of the first light-emitting area, the curve pointed at by the arrow B3 is the microcavity characteristic curve of the second light-emitting area, and the curve pointed at by the arrow B4 is the overall microcavity characteristic curve of a combined light-emitting area consisting of the first light-emitting area and the second light-emitting area.
Figure 5:
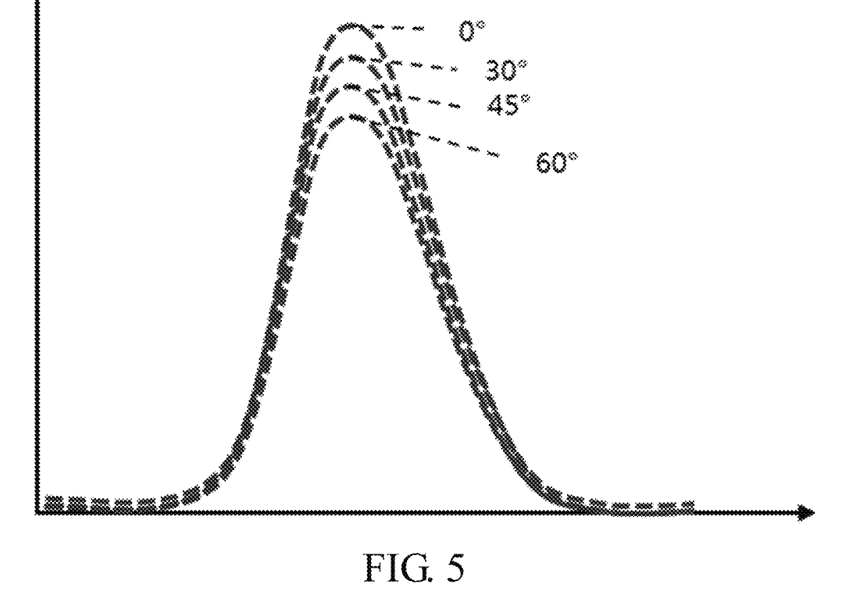
FIG. 5 shows electroluminescence spectrum of a sub-pixel at different viewing angles according to a display panel of the present disclosure.

With reference to FIGS. 4 and 5, advantages provided by the present disclosure are detailed below. FIG. 4 shows an inherent brightness characteristic curve of a light-emitting layer of a sub-pixel and a microcavity characteristic curve of a light-emitting area according to a display panel of the present disclosure, wherein the curve pointed at by the arrow B1 is the inherent brightness characteristic curve of the light-emitting layer of the sub-pixel, the curve pointed at by the arrow B2 is the microcavity characteristic curve of the first light-emitting area, the curve pointed at by the arrow B3 is the microcavity characteristic curve of the second light-emitting area, and the curve pointed at by the arrow B4 is the overall microcavity characteristic curve of a combined light-emitting area consisting of the first light-emitting area and the second light-emitting area. FIG. 5 shows electroluminescence spectrum of a sub-pixel at different viewing angles according to a display panel of the present disclosure. Different light-emitting layers having different thickness produce different microcavity characteristic curve, and the peaks thereof have different positions. The light-emitting layers within the same sub-pixel have different thicknesses, and emit light that overlap with each other at the same time, resulting in that the peak of the overall microcavity characteristic curve has a wide range. Specifically, please see FIG. 4. The microcavity characteristic curve produced by the first light-emitting layer 21 overlaps over with the microcavity characteristic curve produced by the second light-emitting layer 22. This makes the peak of the overall microcavity characteristic curve produced by the sub-pixel have a wider width W. Thus, the position of the peak of the overall microcavity characteristic curve produced by the sub-pixel can overlap with the position of the peak of the inherent brightness characteristic curve of the light-emitting layer within a wider range of angles, such that the electroluminescence spectrum changes less with change of viewing angles. Please refer to FIGS. 1C and 5. FIG. 5 shows electroluminescence spectrum of a sub-pixel of according to the present disclosure at viewing angles of 0 degree, 30 degrees, 45 degrees, and 60 degrees. Compared with FIG. 1C which shows the electroluminescence spectrum of a sub-pixel according to prior art, FIG. 5 shows that the electroluminescence spectrum of a sub-pixel according to the present disclosure changes less with change of viewing angles. Therefore, the color shift at different viewing angles is reduced, and there is no substantial difference for visual sensation for color when viewing the OLED display panel including such sub-pixels at different viewing angles.

Further, please refer to FIG. 3. In the present embodiment, the sub-pixel 2 further includes a pixel defining layer 23. The pixel defining layer 23 includes at least one first opening 231 and at least one second opening 232. The first opening 231 is positioned to correspond to the first light-emitting area A, and the first light-emitting layer 21 is disposed in the first opening 231. The second opening 232 is positioned to correspond to the second light-emitting area B, and the second light-emitting layer 22 is disposed in the second opening 232. In other words, different light-emitting layers having different thicknesses are formed in different openings of the pixel defining layer 23. Specifically, in the present embodiment, the pixel defining layer 23 includes one first opening 231 and one second opening 232. The first opening 231 is positioned to correspond to the first light-emitting area A. The second opening 232 is positioned to correspond to the second light-emitting area B. The first light-emitting layer 21 and the second light-emitting layer 22 having different thicknesses are respectively formed in the first opening 231 and the second opening 232 of the pixel defining layer 23. That is, the light-emitting area of a single one sub-pixel 2 is defined by two different openings of the pixel defining layer 23, ie., the first opening 231 and the second opening 232, where the first light-emitting layer 21 and the second light-emitting layer 22 are independent from each other, and they together constitute the light-emitting layer of the sub-pixel 2.

Moreover, the sub-pixel 2 further includes an anode 24. The anode 24 extends from the first light-emitting area A to the second light-emitting area B. The pixel defining layer 23 is disposed on the anode 24. Both the first light-emitting layer 21 and the second light-emitting layer 22 are formed on the anode 24, and share a same anode 24. The structures and materials of the pixel defining layer 23 and the anode, and connections thereof to other components are well-known by any person having ordinary skill in the art, and thus description thereof are omitted.

In addition, the present disclosure provides a method for manufacturing the above-said sub-pixel. The method for forming the first light-emitting layer 21 and the second light-emitting layer 22 can include but is not limited to ink-jet printing (UP) technique, use of metal mask or other masks, or other methods that can form the light-emitting layer having varied thickness. Two embodiments are provided as examples of the present invention for forming the light-emitting layers. In the first embodiment, the first light-emitting layer 21 and the second light-emitting layer 22 are formed using different masks. In the second embodiment, the first light-emitting layer 21 and the second light-emitting layer 22 are formed using a same mask. Detailed description thereof is provided below.

Figure 6A:
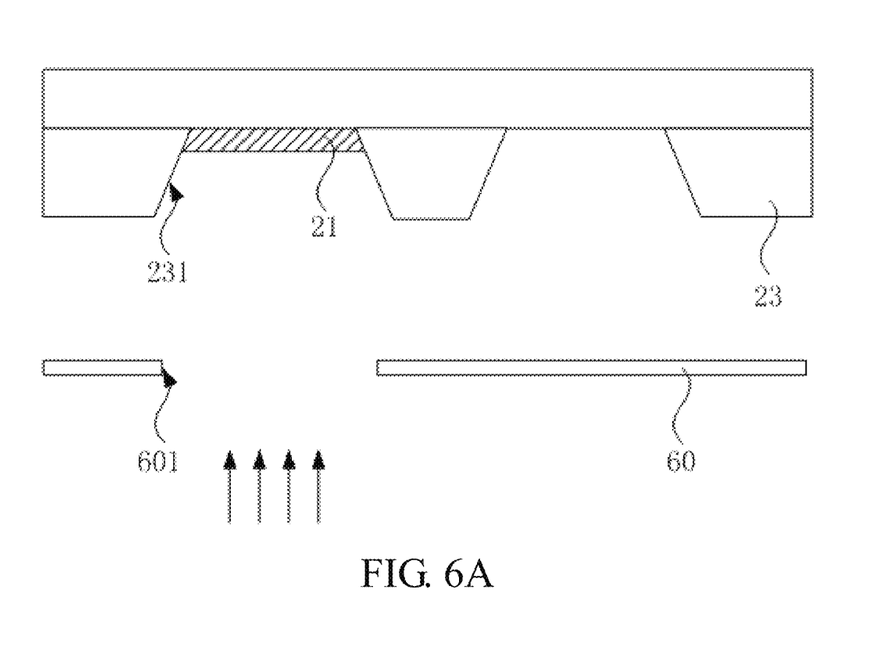
FIGS. 6A and 6B show each stage in a process flow of a method for manufacturing a sub-pixel of a display panel according to a first embodiment of the present disclosure.
Figure 6B:
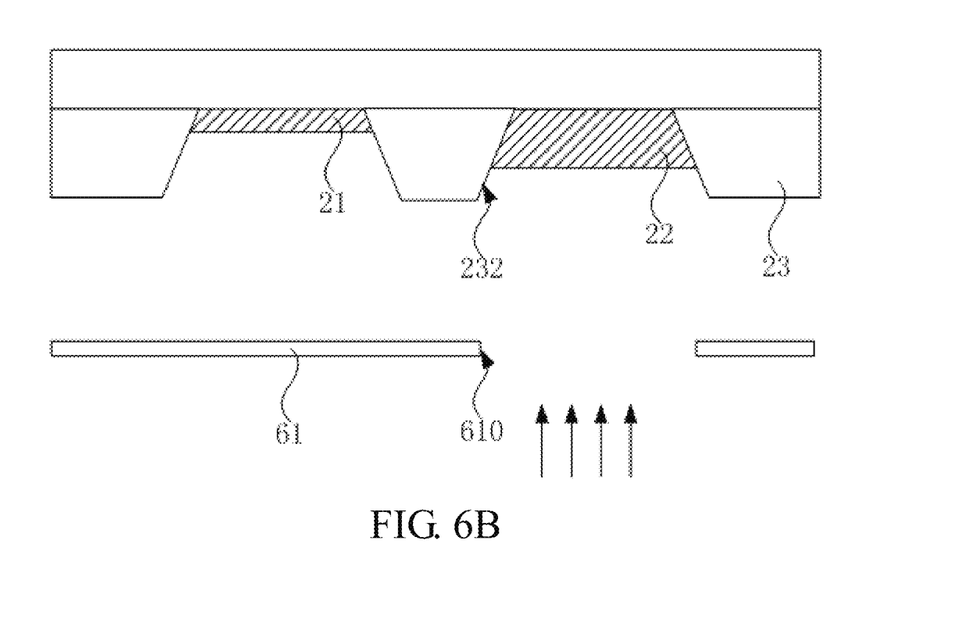

FIGS. 6A and 6B show each stage in a process flow of a method for manufacturing a sub-pixel of a display panel according to a first embodiment of the present disclosure. In the present embodiment, the method includes the following steps.

In FIG. 6A, a first mask 60 having at least one first deposition hole 601 is provided. The first deposition hole 601 is a through-hole of the first mask 60 which allows deposition material to pass therethrough. Next, the first deposition hole 601 is positioned to correspond to the first opening 231 of the pixel defining layer 23. Then, the first light-emitting layer 21 is deposited in the first opening 231. The method used to deposit the first light-emitting layer 21 includes but is not limited to evaporation.

In FIG. 6B, after the first light-emitting layer 21 is formed, a second mask 61 having at least one second deposition hole 610 is provided. Thereafter, the second deposition hole 610 is positioned to correspond to the second opening 232, and the second light-emitting layer 22 is deposited in the second opening 232. The method used to deposit the second light-emitting layer 22 includes but is not limited to evaporation. The deposition leads to the result that thickness of the second light-emitting layer 22 is greater than the thickness of the first light-emitting layer 21, and therefore a structure of the above-said sub-pixel is formed.

In the present embodiment, the first mask 60 and the second mask 61 are different. The first light-emitting layer 21 and the second light-emitting layer 22 are formed using different masks.

Figure 7A:
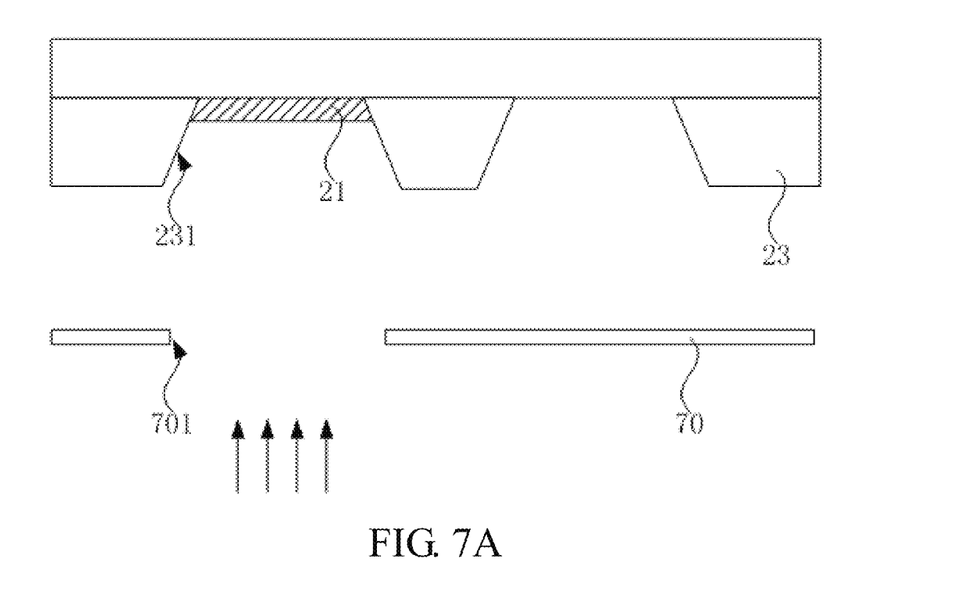
FIGS. 7A and 7B show each stage in a process flow of a method for manufacturing a sub-pixel of a display panel according to a second embodiment of the present disclosure.
Figure 7B:
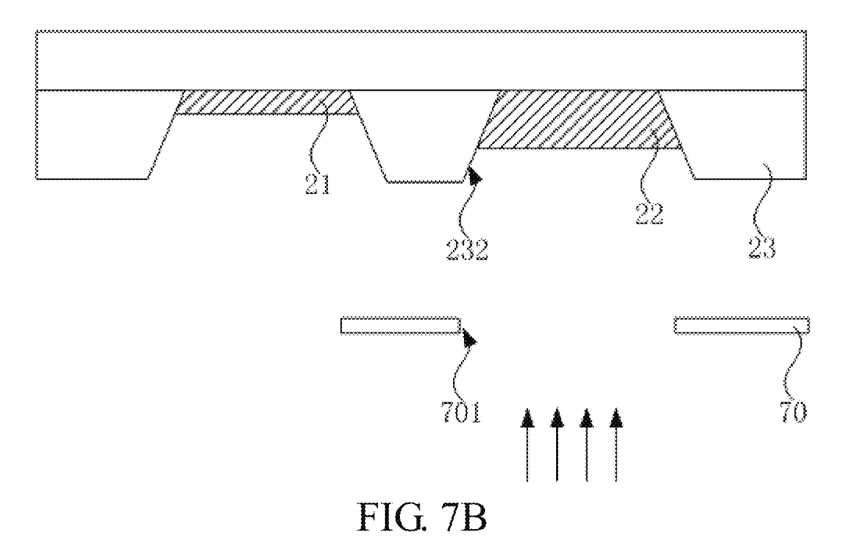

FIGS. 7A and 7B show each stage in a process flow of a method for manufacturing a sub-pixel of a display panel according to a second embodiment of the present disclosure. In the present embodiment, the method includes the following steps.

In FIG. 7A, a first mask 70 having at least one first deposition hole 701 is provided. The first deposition hole 701 is a through-hole of the first mask 70 which allows deposition material to pass therethrough. Next, the first deposition hole 701 is positioned to correspond to the first opening 231 of the pixel defining layer 23. Then, the first light-emitting layer 21 is deposited in the first opening 231. The method used to deposit the first light-emitting layer 21 includes but is not limited to evaporation.

In FIG. 7B, after the first light-emitting layer 21 is formed, the first mask 70 is moved to position the first deposition hole 701 to correspond to the second opening 232, and the second light-emitting layer 22 is deposited in the second opening 232. The method used to deposit the second light-emitting layer 22 includes but is not limited to evaporation. The deposition leads to the result that thickness of the second light-emitting layer 22 is greater than the thickness of the first light-emitting layer 21, and therefore a structure of the above-said sub-pixel is formed.

In the present embodiment, the first mask 70 is moved, and is used to form the first light-emitting layer 21 and the second light-emitting layer 22. The first light-emitting layer 21 and the second light-emitting layer 22 are formed using a same mask.

Figure 8:
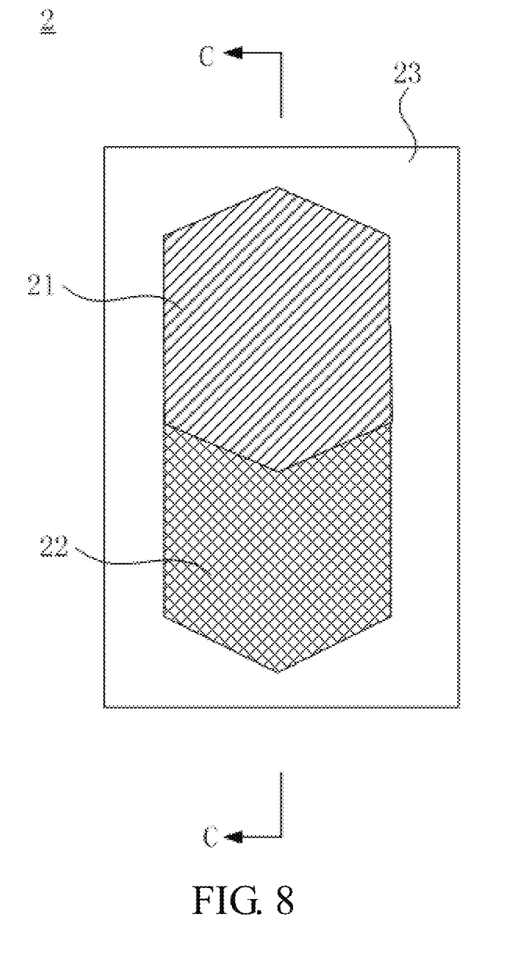
FIG. 8 shows a top view of a sub-pixel of a display panel according to a second embodiment of the present disclosure.
Figure 9:
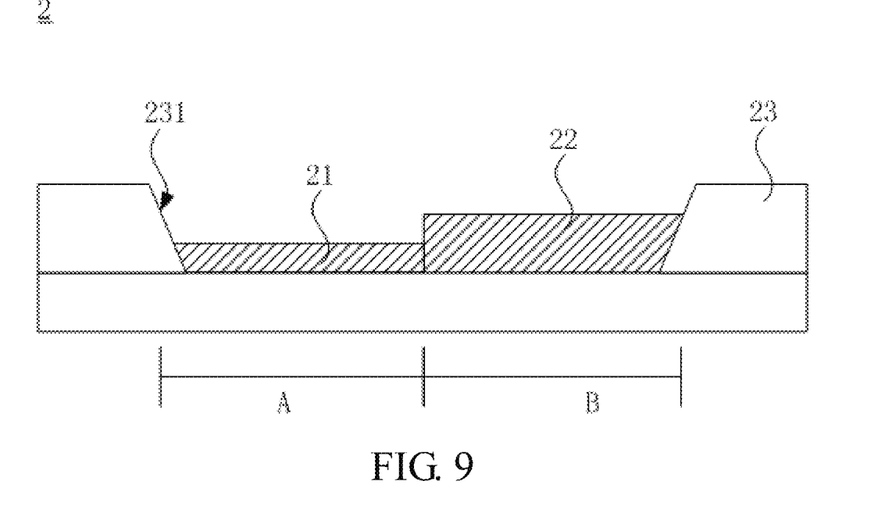
FIG. 9 shows a cross-sectional view of FIG. 8 cut along line C-C.

Please refer to FIGS. 8 and 9. The present disclosure further provides a sub-pixel of a display panel according to a second embodiment of the present disclosure. FIG. 8 shows a top view of a sub-pixel of a display panel according to a second embodiment of the present disclosure. FIG. 9 shows a cross-sectional view of FIG. 8 cut along line C-C. The present embodiment differs from the first embodiment in that, in the present embodiment, the pixel defining layer 23 includes at least one first opening 231, the first opening 231 is positioned to correspond to the first light-emitting area A and the second light-emitting area B, and the first light-emitting layer 21 and the second light-emitting layer 22 are disposed in a same first opening 231. That is, a light-emitting layer having varied thickness is formed in a same opening of the pixel defining layer 23. Specifically, in the present embodiment, the pixel defining layer 23 includes one first opening 231. The first opening 231 is positioned to correspond to the first light-emitting area A and the second light-emitting area B. The first light-emitting layer 21 and the second light-emitting layer 22 having different thicknesses are formed in the same first opening 231. That is, the first light-emitting area A and the second light-emitting area B of a single one sub-pixel 2 are defined by one first opening 231, such that the light-emitting layers in the same first opening have different thicknesses in different areas, and the light-emitting layers in the same first opening having different thicknesses together constitute the light-emitting layer of the sub-pixel 2.

In addition, the present disclosure provides a method for manufacturing the above-said sub-pixel. The method for forming the first light-emitting layer 21 and the second light-emitting layer 22 can include but is not limited to ink-jet printing (IF) technique, use of metal mask or other masks, or other methods that can form the light-emitting layer having varied thickness. Two embodiments are provided as examples of the present invention for forming the light-emitting layers. In the third embodiment, the first light-emitting layer 21 and the second light-emitting layer 22 are formed using different masks. In the fourth embodiment, the first light-emitting layer 21 and the second light-emitting layer 22 are formed using a same mask. Detailed description thereof is provided below.

Figure 10A:
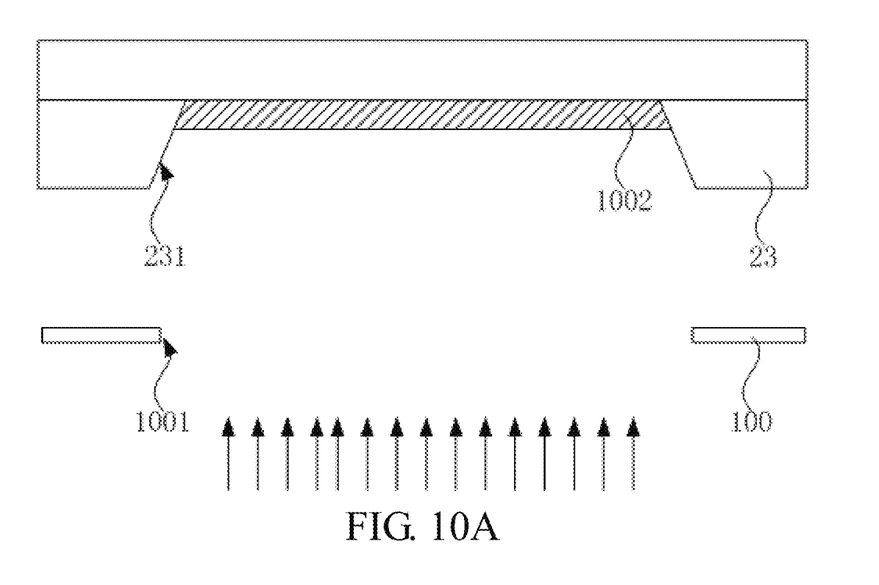
FIGS. 10A and 10B show each stage in a process flow of a method for manufacturing a sub-pixel of a display panel according to a third embodiment of the present disclosure.
Figure 10B:
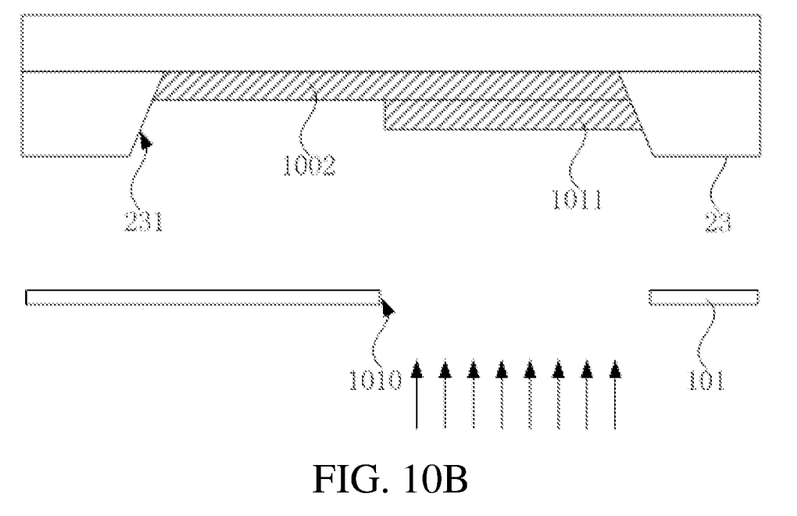

FIGS. 10A and 10B show each stage in a process flow of a method for manufacturing a sub-pixel of a display panel according to a third embodiment of the present disclosure. In the present embodiment, the method includes the following steps.

In FIG. 10A, a first mask 100 having at least one first deposition hole 1001 is provided. The first deposition hole 1001 is a through-hole of the first mask 100 which allows deposition material to pass therethrough. Next, the first deposition hole 1001 is positioned to correspond to the first opening 231 of the pixel defining layer 23. Then, a bottom light-emitting layer 1002 is deposited in the first opening 231. The method used to deposit the bottom light-emitting layer 1002 includes but is not limited to evaporation.

In FIG. 10B, a second mask 101 having at least one second deposition hole 1010 is provided. The second deposition hole 1010 is a through-hole of the second mask 101 which allows deposition material to pass therethrough. Thereafter, the second deposition hole 1010 is positioned to correspond to a portion of the first opening 231, and a top light-emitting layer 1011 is deposited in the first opening 231. Specifically, in the present embodiment, a width of the second deposition hole 1010 is less than a width of the first opening 231. This makes that the top light-emitting layer 1011 is deposited in the first opening 231 at position corresponding to the second deposition hole 1010, and there is no the top light-emitting layer 1011 being deposited in the first opening 231 at position that does not correspond to the second deposition hole 1010. For the portion where the top light-emitting layer 1011 is deposited, the bottom light-emitting layer 1002 overlaps with the top light-emitting layer 1011 to constitute the second light-emitting layer 22. In the non-overlapping region, the bottom light-emitting layer 1002 serves as the first light-emitting layer 21.

In the present embodiment, the first light-emitting layer 21 and the second light-emitting layer 22 are disposed in the same first opening 231. The first mask 100 and the second mask are different. That is, the first light-emitting layer 21 and the second light-emitting layer 22 are formed using different masks.

Figure 11A:
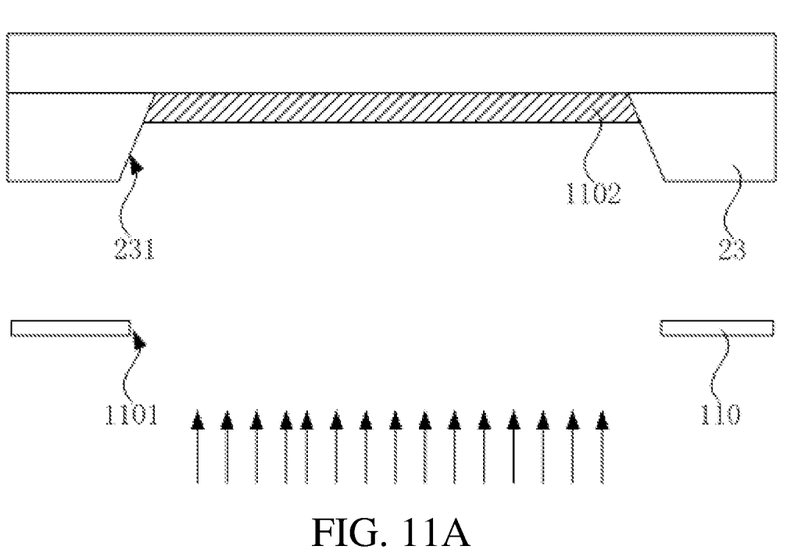
FIGS. 11A and 11B show each stage in a process flow of a method for manufacturing a sub-pixel of a display panel according to a fourth embodiment of the present disclosure.
Figure 11B:
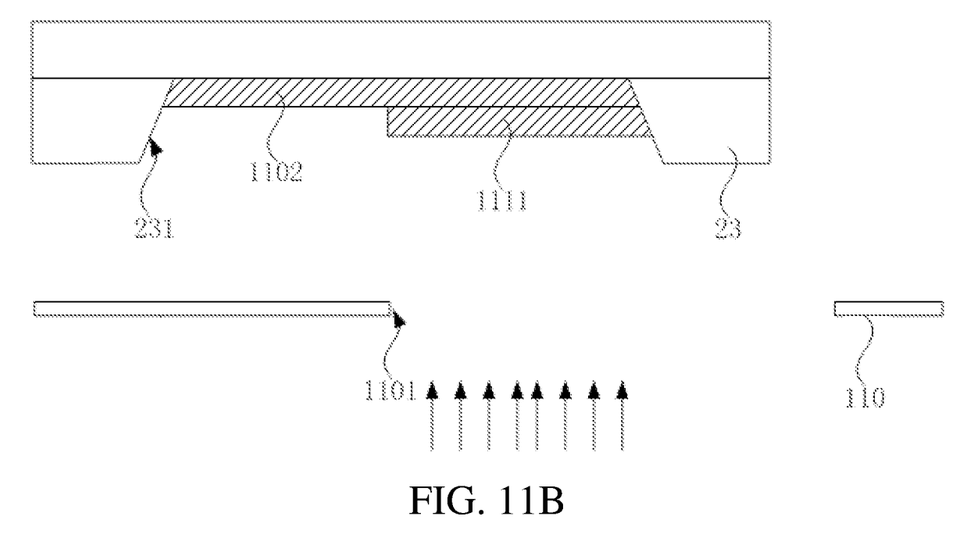

FIGS. 11A and 11B show each stage in a process flow of a method for manufacturing a sub-pixel of a display panel according to a fourth embodiment of the present disclosure. In the present embodiment, the method includes the following steps.

In FIG. 11A, a first mask 110 having at least one first deposition hole 1101 is provided. The first deposition hole 1101 is a through-hole of the first mask 110 which allows deposition material to pass therethrough. Next, the first deposition hole 1101 is positioned to correspond to the first opening 231 of the pixel defining layer 23. Then, a bottom light-emitting layer 1102 is deposited in the first opening 231. The method used to deposit the bottom light-emitting layer 1102 includes but is not limited to evaporation.

In FIG. 11B, after the bottom light-emitting layer 1102 is formed, the first mask 110 is moved to position the first deposition hole 1101 to correspond to a portion of the first opening 231. Specifically, the first mask 110 is moved, such that a portion of the first opening 231 is shielded, and a top light-emitting layer 1111 is deposited in the non-shielded portion of the first opening 231. The method used to deposit the top light-emitting layer 1111 includes but is not limited to evaporation. For the portion where the top light-emitting layer 1111 is deposited, the bottom light-emitting layer 1102 overlaps with the top light-emitting layer 1111 to constitute the second light-emitting layer 22. In the non-overlapping region, the bottom light-emitting layer 1102 serves as the first light-emitting layer 21.

In the present embodiment, the first light-emitting layer 21 and the second light-emitting layer 22 are disposed in the same first opening 231. The first mask 110 is moved, and is used to form the first light-emitting layer 21 and the second light-emitting layer 22. The first light-emitting layer 21 and the second light-emitting layer 22 are formed using a same mask.

Furthermore, the display panel includes a plurality of sub-pixels, wherein at least one sub-pixel has a structure that is the same as that of the above-said sub-pixel. In other words, the display panel includes a plurality of red sub-pixels, a plurality of green sub-pixels, a plurality of blue sub-pixels, and a plurality of white sub-pixels, wherein at least one sub-pixel has a structure that is the same as that of the above-said sub-pixel. Additionally, the display panel includes a first type of sub-pixel, a second type of sub-pixel, and a third type of sub-pixel, wherein at least one type of the sub-pixels has a structure that is the same as that of the above-said sub-pixel. In other words, in the display panel, all the sub-pixels of a same type have a structure that is the same as that of the above-said sub-pixel. For example, all the red sub-pixels have a structure that is the same as that of the sub-pixel of the present disclosure, or two or over two types of sub-pixels have a structure that is the same as that of the sub-pixel of the present disclosure.

In addition, the present disclosure provides an electronic device including the above-said display panel. It is understood that the electronic device can include but is not limited to a mobile phone, a flat panel computer, a calculating device, a game device, a television, a display screen, a wearable device, and other appliances or household appliances having display function.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

INDUSTRIAL APPLICABILITY

The inventions provided by the present disclosure can be made and used in industry, and thus possess industrial applicability.

What is claimed is:

1. A method for manufacturing a display panel, comprising steps of:
   providing the display panel including a plurality of sub-pixels and a pixel defining layer, wherein at least one of the sub-pixels comprises at least one first light-emitting area and at least one second light-emitting area, the first light-emitting area and the second light-emitting area are sequentially arranged in a direction perpendicular to a light-emitting direction of the sub-pixel, and the pixel defining layer comprises at least one first opening and at least one second opening, the first opening is positioned to correspond to the first light-emitting area;
   providing a first mask having at least one first deposition hole, positioning the first deposition hole to correspond to the first opening, and depositing a first light-emitting layer in the first opening; and
   providing a second mask having at least one second deposition hole, positioning the second deposition hole to correspond to the second opening, and depositing a second light-emitting layer in the second opening such that a thickness of the second light-emitting layer is greater than a thickness of the first light-emitting layer.

2. The method for manufacturing the display panel according to claim 1, wherein
   the first mask and the second mask are same, and
   in the step of providing the second mask, the first mask is moved to position the first deposition hole to correspond to the second opening, and the second light-emitting layer is deposited in the second light-emitting area.

* * * * *